（12）United States Patent
Teng

(10) Patent No.: US 9,966,725 B1
(45) Date of Patent: May 8, 2018

(54) PULSED LIGHT BEAM SPECTRAL FEATURE CONTROL

(71) Applicant: Cymer, LLC, San Diego, CA (US)

(72) Inventor: Kuo-Tai Teng, Poway, CA (US)

(73) Assignee: Cymer, LLC, San Diego, CA (US)

( * ) Notice: Subject to any disclaimer, the term of this patent is extended or adjusted under 35 U.S.C. 154(b) by 0 days. days.

(21) Appl. No.: 15/468,402

(22) Filed: Mar. 24, 2017

(51) Int. Cl.
*H01S 3/10* (2006.01)
*G02B 26/00* (2006.01)
*H01S 3/23* (2006.01)
*H01S 3/03* (2006.01)
*H01S 3/00* (2006.01)
*G03F 7/20* (2006.01)
*H01L 21/027* (2006.01)

(52) U.S. Cl.
CPC ........ *H01S 3/10015* (2013.01); *G02B 26/007* (2013.01); *G03F 7/7055* (2013.01); *H01S 3/005* (2013.01); *H01S 3/03* (2013.01); *H01S 3/1003* (2013.01); *H01S 3/2308* (2013.01); *H01L 21/0275* (2013.01)

(58) Field of Classification Search
CPC ............................ H01S 3/10015; G02B 26/007
See application file for complete search history.

(56) References Cited

U.S. PATENT DOCUMENTS

| 7,203,216 | B2 | 4/2007 | Ershov et al. |
| 7,653,095 | B2 * | 1/2010 | Reiley ................. G03F 7/70025 372/20 |
| 7,830,934 | B2 | 11/2010 | Jacques et al. |
| 7,894,494 | B2 | 2/2011 | Ishihara |
| 7,899,095 | B2 | 3/2011 | Partlo |
| 8,098,698 | B2 | 1/2012 | Dunstan et al. |
| 2006/0227839 | A1 | 10/2006 | Besaucele et al. |
| 2011/0205512 | A1 | 8/2011 | Seong et al. |
| 2011/0249691 | A1 | 10/2011 | O'Brien et al. |
| 2015/0070673 | A1 * | 3/2015 | Lalovic ............... G03F 7/70041 355/67 |
| 2016/0380402 | A1 | 12/2016 | O'Brien et al. |

* cited by examiner

*Primary Examiner* — Eric Bolda
(74) *Attorney, Agent, or Firm* — DiBerardino McGovern IP Group LLC

(57) ABSTRACT

A spectral feature of a pulsed light beam produced by an optical source is adjusted by receiving an instruction to change a spectral feature of the pulsed light beam from a value in a first target range to a value in a second target range; regulating a first operating characteristic of the optical source; determining an adjustment to a second actuatable apparatus of the optical source; and adjusting the second actuatable apparatus by an amount based on the determined adjustment. The first operating characteristic is regulated by adjusting a first actuatable apparatus of the optical source until it is determined that the first operating characteristic is within an acceptable range of values. The adjustment to the second actuatable apparatus is determined based at least in part on: a relationship between the adjustment of the first actuatable apparatus and a spectral feature of the light beam, and the second target range.

25 Claims, 7 Drawing Sheets

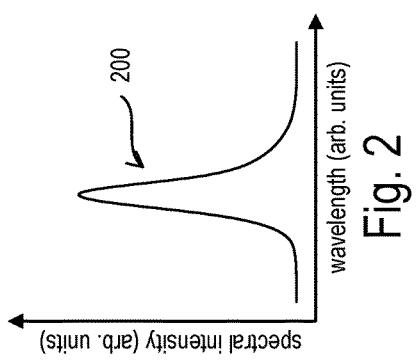
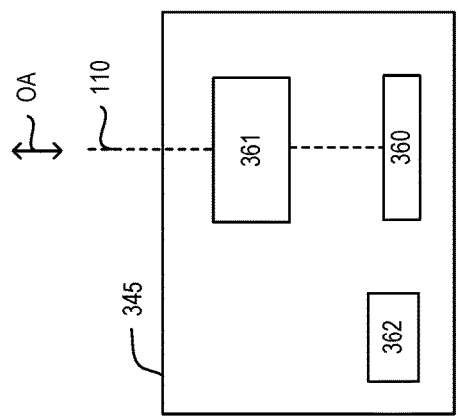
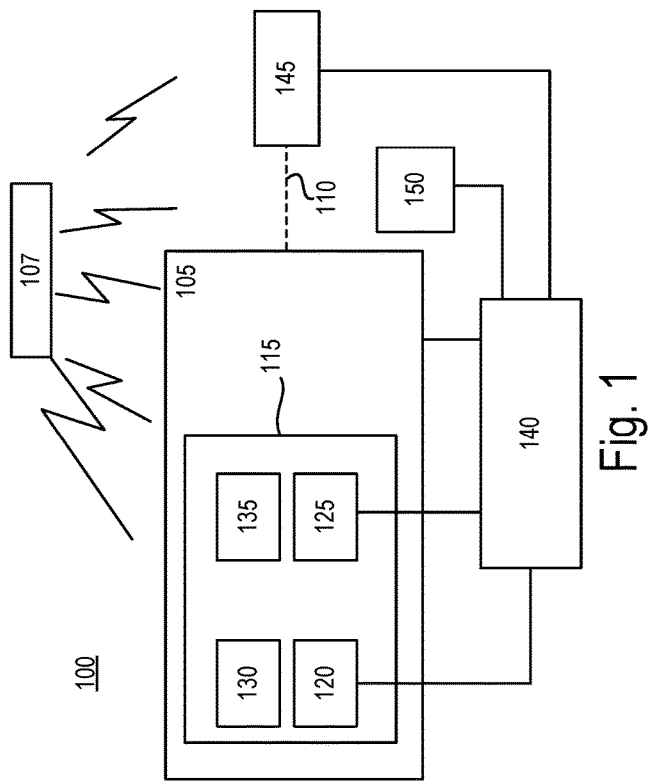
Fig. 2
Fig. 3
Fig. 1

PULSED LIGHT BEAM SPECTRAL FEATURE CONTROL

TECHNICAL FIELD

The disclosed subject matter relates to controlling a spectral feature of a pulsed light beam produced by an optical source.

BACKGROUND

In semiconductor lithography (or photolithography), the fabrication of an integrated circuit (IC) includes performing a variety of physical and chemical processes on a semiconductor (for example, silicon) substrate (which is also referred to as a wafer). A photolithography exposure apparatus or scanner is a machine that applies a desired pattern onto a target portion of the substrate. The wafer is irradiated by a light beam that extends along an axial direction, and the wafer is fixed to a stage so that the wafer generally extends along a lateral plane that is substantially orthogonal to the axial direction. The light beam has a wavelength in the deep ultraviolet (DUV) range, for example, from about 10 nanometers (nm) to about 400 nm. The light beam travels along the axial direction (which that is orthogonal to the lateral plane along which the wafer extends).

A spectral analysis module is used to measure spectral features of the light beam, and such measured spectral features are used to control aspects of the light beam. By controlling the light beam, various lithography properties can be controlled, For example, a minimum feature size or critical dimension (CD) at the wafer can be controlled, or pattern properties such as overlay, surface roughness, and proximity correction can be controlled.

SUMMARY

In some general aspects, a spectral feature of a pulsed light beam produced by an optical source is adjusted using a method. The method includes: receiving an instruction to change a spectral feature of the pulsed light beam from a value in a first target range to a value in a second target range; regulating a first operating characteristic of the optical source; determining an adjustment to a second actuatable apparatus of the optical source; and adjusting the second actuatable apparatus by an amount that is based on the determined adjustment. The first operating characteristic is regulated by adjusting a first actuatable apparatus of the optical source until it is determined that the first operating characteristic is within an acceptable range of values. The adjustment to the second actuatable apparatus is determined based at least in part on: a relationship between the adjustment of the first actuatable apparatus and a spectral feature of the light beam, and the second target range.

Implementations can include one or more of the following features. For example, the first operating characteristic of the optical source can be regulated by performing the regulation as a feedback loop that includes: observing the first operating characteristic of the optical source after the first actuatable apparatus is adjusted; determining whether the observed first operating characteristic is within the acceptable range of values; and adjusting a first actuatable apparatus of the optical source if it is determined that the observed first operating characteristic is outside the acceptable range of values.

At least some of determining the adjustment to the second actuatable apparatus and at least some of adjusting the second actuatable apparatus can occur before it is determined that the first operating characteristic is within the acceptable range of values.

The adjustment to the second actuatable apparatus can be determined by an offset in the spectral feature of the light beam caused by the adjustment of the first actuatable apparatus. The offset can be estimated based on: a difference between the initial value of the first operating characteristic and a target value of the first operating characteristic, in which the target value of the first operating characteristic is within the acceptable range of values; a calibrated value that defines a relationship between the first operating characteristic and the state of the first actuatable apparatus; and a slope of a timing curve of a measured spectral feature of the light beam versus the state of the first actuatable apparatus. The adjustment to the second actuatable apparatus can be determined by calculating an offset adjustment to the second actuatable apparatus that compensates for the estimated offset in the spectral feature of the light beam caused by the adjustment of the first actuatable apparatus. The offset adjustment to the second actuatable apparatus can be calculated by multiplying the estimated offset by a slope of the relationship between a measured spectral feature of the light beam and a state of the second actuatable apparatus. The adjustment to the second actuatable apparatus of the optical source can be determined by calculating a main adjustment to the second actuatable apparatus that corresponds to the second target range. The adjustment to the second actuatable apparatus of the optical source can be determined by adding the offset adjustment and the main adjustment together to determine the adjustment.

The method can include, after the second actuatable apparatus has completed its adjustment: maintaining the second actuatable apparatus at its current state while measuring the spectral feature of the light beam; and adjusting the second actuatable apparatus until the measured spectral feature of the light beam is within the second target range. The spectral feature of the light beam can be measured by measuring the spectral feature of the light beam for every pulse of the light beam in a set of N pulses, in which N is a number less than 30.

The first operating characteristic of the optical source can include a relative value between a state of the first actuatable apparatus and a target state of the first actuatable apparatus; and the first actuatable apparatus can be a timing relating to when the optical source outputs a pulse of the light beam. The timing relating to when the optical source outputs a pulse of the light beam can be a relative timing between a first trigger signal sent to a first stage of the optical source and a second trigger signal sent to a second stage of the optical source.

The second actuatable apparatus can include an optical system configured to interact with the pulsed light beam; and adjusting the second actuatable apparatus can include adjusting the optical system to thereby adjust an optical magnification of the pulsed light beam.

The adjustment to the optical magnification of the pulsed light beam can alter the spectral feature of the light beam.

The spectral feature of the light beam can be a bandwidth of the light beam.

The adjustment to the first actuatable apparatus of the optical source can cause the spectral feature of the light beam to change within a first extent of values and at a first speed; the adjustment to the second actuatable apparatus of the optical source can cause the spectral feature of the light beam to change within a second extent of values and at a second speed; the second extent of values can be larger than the first extent of values; and the second speed can be slower than the first speed.

The acceptable range of values of the first operating characteristic can be centered in an operating range of the first operating characteristic, in which the operating range of the first operating characteristic can be defined by limiting values of the first operating characteristic.

In other general aspects, a system adjusts a spectral feature of a pulsed light beam produced by an optical source. The system includes: a first actuation module coupled to a first actuatable apparatus of the optical source, the first actuatable apparatus configured to be adjusted by the first actuation module to thereby adjust the spectral feature of the pulsed light beam within a first extent of values; a second actuation module coupled to a second actuatable apparatus of the optical source, the second actuatable apparatus configured to be adjusted by the first actuation module to thereby adjust the spectral feature of the pulsed light beam within a second extent of values; and a control system connected to the first actuation module and the second actuation module. The control system is configured to: receive an instruction to change the spectral feature of the pulsed light beam from a value in a first target range to a value in a second target range; regulate a first operating characteristic of the optical source, wherein regulating the first operating characteristic includes adjusting the first actuatable apparatus until it is determined that the first operating characteristic is within an acceptable range of values; determine an adjustment to the second actuatable apparatus based at least in part on a relationship between the adjustment of the first actuatable apparatus and the spectral feature of the light beam, and the second target range; and adjust the second actuatable apparatus by an amount that is based on the determined adjustment.

Implementations can include one or more of the following features. For example, the first operating characteristic of the optical source can include a relative value between a state of the first actuatable apparatus and a target state of the first actuatable apparatus; and the first actuatable apparatus can be a timing relating to when the optical source outputs a pulse of the light beam. The optical source can be a multi-stage gas discharge system including a first stage and a second stage. The timing relating to when the optical source outputs a pulse of the light beam can be a relative timing between a first trigger signal sent to the first stage of the optical source and a trigger signal sent to a second stage of the optical source. The first stage can include an oscillator apparatus that outputs a pulsed seed light beam and the second stage can include an optical amplification apparatus that receives the pulsed seed light beam and outputs the pulsed light beam.

The second actuatable apparatus can include an optical system that interacts with the pulsed light beam and is configured to adjust an optical magnification of the pulsed light beam. The adjustment to the optical magnification of the pulsed light beam can thereby alter the spectral feature of the light beam. The optical system can include one or more prisms through which the pulsed light beam travels, and a grating on which the pulsed light beam reflects. The optical magnification of the pulsed light beam can be adjusted by rotating one or more of the prisms.

The system can also include a metrology apparatus including an observation system configured to measure the first operating characteristic. The control system can be configured to receive the measurement of the first operating characteristic from the observation system. The metrology apparatus can include a spectral feature unit configured to measure the spectral feature of the pulsed light beam. The control system can be configured to receive the measurement of the spectral feature from the spectral feature unit.

In other general aspects, a system adjusts a spectral feature of a pulsed light beam produced by an optical source. The system includes: a first actuatable means for adjusting the spectral feature of the pulsed light beam within a first extent of values; a first actuation means for controlling the first actuatable means; a second actuatable means for adjusting the spectral feature of the pulsed light beam within a second extent of values; a second actuation means for controlling the second actuatable means; and a control means connected to the first actuation means and the second actuation means. The control means is for: receiving an instruction to change the spectral feature of the pulsed light beam from a value in a first target range to a value in a second target range; regulating a first operating characteristic of the optical source; determining an adjustment to the second actuatable means; and sending a signal to the second actuation means to adjust the second actuatable means by an amount that is based on the determined adjustment. The first operating characteristic is regulated by sending a signal to the first actuation means to adjust the first actuatable means until it is determined that the first operating characteristic is within an acceptable range of values. The adjustment to the second actuatable means is determined based at least in part on a relationship between the adjustment of the first actuatable means and the spectral feature of the light beam, and the second target range.

DESCRIPTION OF DRAWINGS

FIG. 1 is a block diagram of an photolithography system including an actuation system having a first actuatable apparatus and a second actuatable apparatus for controlling a pulsed light beam directed to an output apparatus;

FIG. 2 is a graph of an optical spectrum of the pulsed light beam;

FIG. 3 is a block diagram of an implementation of the output apparatus of FIG. 1;

DESCRIPTION

Figure 4:
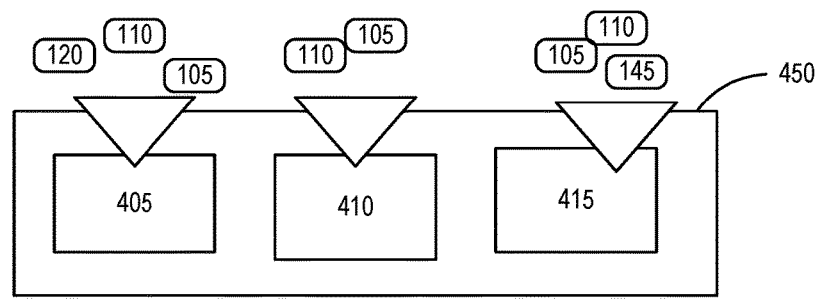
FIG. 4 is a block diagram of an implementation of a metrology apparatus that can be used in the photolithography system of FIG. 1.

Referring to FIG. 1, a photolithography system 100 includes an optical source 105 that produces a pulsed light beam 110 that is directed to an output apparatus 145 (such as a photolithography exposure apparatus that patterns microelectronic features on a wafer, as shown in FIG. 3). The output apparatus 145 uses the pulsed light beam 110 to perform one or more functions (such as patterning a wafer). The efficiency and quality of the performed functions depend on various characteristics of the optical spectrum of the light beam 110.

Referring to FIG. 2, the optical spectrum 200 (or emission spectrum) of the pulsed light beam 110 produced by the optical source 105 contains information about how the optical energy, intensity, or power of the light beam 100 is distributed over different wavelengths (or frequencies). The optical spectrum 200 of the light beam 110 is depicted in the form of a diagram where the spectral intensity is plotted as a function of the wavelength or optical frequency. The optical spectrum 200 can be referred to as the spectral shape or intensity spectrum of the light beam 110. Spectral features of the light beam 110 include any aspect or representation of the intensity spectrum. For example, a wavelength at a particular value of intensity is a spectral feature. As another example, a width of a shape of the optical spectrum 200 is a spectral feature. This width can be referred to as a bandwidth and its value can be given in terms of wavelength or frequency of the light beam 110.

During operation of the optical source, various disturbances 107 (such as temperature gradients, pressure gradients, optical distortions, change in operating conditions, etc.) act on the optical source 105 and the light beam 110 to modify the optical spectrum 200 and therefore the spectral features of the light beam 110. Because of the disturbances 107, the actual optical spectrum 200 and therefore the actual spectral features (such as the bandwidth or the wavelength) of the light beam 110 at the output apparatus 145 may not correspond to or match with the optical spectrum or spectral feature that is desired at the output apparatus 145. Thus, the actual spectral feature or features of light beam 110 are measured or estimated during operation using a metrology apparatus 150. A control system 140 analyzes the measured or estimated spectral feature, and determines how to effect a change to one or more properties of the optical source 105 to thereby adjust the optical spectrum 200 and also the spectral feature of interest of the light beam 110. The control system 140 sends a signal to an actuation system 115 to effect the change to the one or more properties of the optical source 105.

The actuation system 115 includes two or more actuation modules (such as first actuation module 120 and second actuation modules 125) that communicate with the control system 140. The first and second actuation modules 120, 125 each include electronics in the form of any combination of firmware and software. The first and second actuation modules 120, 125 are coupled to respective first and second actuatable apparatuses 130, 135 of the optical source 105. The first actuatable apparatus 130 is altered by the first actuation module 120 (under the control of the control system 140) to effect a change to one or more properties of the optical source 105 to thereby adjust the spectral feature of the pulsed light beam 110. The second actuatable apparatus 135 is altered by the second actuation module 125 (under the control of the control system 140) to effect a change to one or more properties of the optical source 105 to thereby adjust the spectral feature of the pulsed light beam 110. The one or more properties that are changed by the second actuatable apparatus 135 can be different from the one or more properties that are changed by the first actuatable apparatus 130. In this way, the effect of these disturbances 107 on the light beam 110 can be corrected.

It is possible and sometimes necessary to configure the optical system 100 so that the first actuatable apparatus 130 is able to act more quickly and/or within a more fine tuning range than the second actuatable apparatus 135 to effect the adjustment to the spectral feature of the light beam 110. In particular, in some implementations, adjusting the first actuatable apparatus 130 causes the spectral feature of the light beam 110 to change within a first extent of values and at a first speed or rate while adjusting the second actuatable apparatus 135 causes the spectral feature of the light beam 110 to change within a second extent of values and at a second speed or rate. The second extent of values can be larger than the first extent of values; thus, the tuning range of the second actuatable apparatus 135 is coarser than the turning range of the first actuatable apparatus 130. The second speed can be slower than the first speed; thus, the second actuatable apparatus 135 acts more slowly to change the spectral feature than the first actuatable apparatus 130. For example, the first actuatable apparatus 130 changes the spectral feature at a rate of 6 kHz, and thus can change the spectral feature of the light beam 110 from a value in the first target range to a value in the second target range in under 0.2 milliseconds (ms). On the other hand, in this example, the second actuatable apparatus 135 requires at least 20 ms to change the spectral feature of the light beam 110 from a value in the first target range to a value in the second target range. Thus, in this example, the first actuatable apparatus is one hundred times faster at effecting a change in the spectral feature of the light beam 110 than the second actuatable apparatus 135.

The actuation system 115 operates under two modes, although in other implementations of the actuation system 115 additional modes are possible. One mode is a steady state operation mode in which the output apparatus 145 requires that the spectral feature of the light beam 110 be held constant. Another mode is a change state operation mode in which the output apparatus 145 requires a change in the spectral feature (for example, from a value in a first target range to a value in a second target range) of the light beam 110. Under steady state operation, the second actuatable apparatus 135 can be held in a current state (under control of the second actuation module 125) and, because it is relatively more quickly acting, the first actuatable apparatus 130 can be adjusted (under control of the first actuation module 120) to account for minor or small changes to the spectral feature caused by the disturbances 107. Under change state operation, the second actuatable apparatus 135 is adjusted (under control of the second actuation module 125) and the first actuatable apparatus 130 is held in a change state (under control of the first actuation module 120).

The control system 140 is configured to reduce the time it takes to perform the change state operation, for example, by 25-75%. By reducing the time it takes to perform the change state operation, the optical source 110 can more quickly change the spectral feature of the light beam 110. The output apparatus 145 thus can effect a faster change in the spectral feature of the light beam 110 without reducing the throughput or production of the output apparatus 145. The output apparatus 145 generally needs to adjust the spectral feature or features of the light beam 110 in order to perform required functions such as patterning the wafer.

The control system 140 and the actuation system 115 are configured and designed to reduce the time it takes to perform the change state operation by adjusting the second actuatable apparatus 135 by an amount that is based at least in part on a relationship between the adjustment of the first actuatable apparatus 130 and the spectral feature of the light beam 110 and also on the second target range. Moreover, the second actuatable apparatus 135 can be adjusted during the time that the first actuatable apparatus 130 is being moved from a previous state to the change state instead of waiting until the first actuatable apparatus 130 has reached the change state. In this way, the second actuatable apparatus 135 can be adjusted earlier and without having to wait for the metrology apparatus 150 to collect measurements of the spectral feature of the light beam 110.

Details about the photolithography system 100 are provided next before a discussion of the change state operation.

Referring again to FIG. 1, while not shown, the light beam 110 may also be directed through a beam preparation system placed between the optical source 105 and the output apparatus 145. The beam preparation system can include optical elements that modify aspects of the light beam 110. For example, the beam preparation system can include reflective or refractive optical elements, optical pulse stretchers, and optical apertures (including automated shutters).

Referring to FIG. 3, in some implementations, the output apparatus 145 is a photolithography exposure apparatus 345 for patterning the wafer 360. The photolithography exposure apparatus 345 includes an optical arrangement that includes an illuminator system 361 having, for example, one or more condenser lenses, a mask, and an objective arrangement. The mask is movable along one or more directions, such as along an optical axis OA of the light beam 110 or in a plane that is perpendicular to the optical axis OA. The objective arrangement includes a projection lens and enables the image transfer to occur from the mask to the photoresist on the wafer 360. The illuminator system 361 adjusts the range of angles for the light beam 110 impinging on the mask. The illuminator system 361 also homogenizes (makes uniform) the intensity distribution of the light beam 110 across the mask. The photolithography exposure apparatus 345 can include, among other features, a lithography controller 362, air conditioning devices, and power supplies for the various electrical components. The lithography controller 362 controls how layers are printed on the wafer 360. The lithography controller 362 is connected to the control system 140.

The wafer 360 is irradiated by the light beam 110. A process program or recipe determines the length of the exposure on the wafer 360, the mask used, as well as other factors that affect the exposure. During lithography, a plurality of pulses of the light beam 110 illuminates the same area of the wafer 360 to form an illumination dose. The number of pulses N of the light beam 110 that illuminate the same area of the wafer 360 can be referred to as an exposure window or slit and the size of this slit can be controlled by an exposure slit placed before the mask. In some implementations, the value of N is in the tens, for example, from 10-100 pulses. In other implementations, the value of N is greater than 100 pulses, for example, from 100-500 pulses. One or more of the mask, the objective arrangement, and the wafer 360 can be moved relative to each other during the exposure to scan the exposure window across an exposure field. The exposure field is the area of the wafer 360 that is exposed in one scan of the exposure slit or window.

In order to pattern the wafer 360, the light beam 110 has a wavelength in the deep ultraviolet (DUV) range, which is between 10 nm and 400 nm. In an implementation in which the optical source 105 uses a gas discharge design filled with a gain medium that includes argon fluoride (ArF), then the light beam 110 has a wavelength of about 193 nm. In an implementation in which the optical source 105 uses a gas discharge design filled with a gain medium that includes krypton fluoride (KrF) then the light beam 110 has a wavelength of about 248 nm. The spectral features of the light beam 110 have a direct impact on the quality of imaging at the wafer 360. Specifically, the size and shape of the microelectronic features patterned on the wafer 360 depend on the optical spectrum 200 of the light beam 110. In general, the smaller the wavelength of the light beam 110, the smaller the features than can be patterned.

Referring to FIG. 4, in some implementations, the metrology apparatus 150 is designed as a metrology apparatus 450 that includes an observation system 405 that is configured to observe one or more operating characteristics associated with the first actuation module 120. The observation system 405 can be configured to observe characteristics associated with one or more other components of the photolithography system 100 such as the optical source 105 and the output apparatus 145, as discussed in more detail below.

The observation system 405 is configured to output these characteristics to the control system 140, which can calculate or estimate a metric that indicates an operating point of the first actuatable apparatus 130. The operating point of the first actuatable apparatus 130 characterizes where, within a range of possible settings, values, or conditions, the first actuatable apparatus 130 is presently operating. In some implementations, as discussed below with respect to FIG. 5, the first actuatable apparatus 130 is a timing module that is connected to a first stage (the master oscillator 500) and to a second stage (the power amplifier 510) of an exemplary optical source 505 to control a relative timing between a first trigger signal sent to the master oscillator 500 and a second trigger signal sent to the power amplifier 510. This relative timing can be referred to as differential timing. In these implementations, the metric for the operating point of the first actuatable apparatus 130 can quantify the displacement of the actual relative timing from the peak efficiency differential timing (Tpeak). The peak efficiency differential timing is the value of the relative timing when the optical source 105 or 505 produces a light beam 110 having maximum energy at a particular input energy applied to the optical source 105 or 505 (for example, the input energy can be based on the voltage applied to electrodes of one or more gas discharge chambers of the optical source 105 or 505).

The metric for the operating point (MPOP) of the first actuatable apparatus 130 can be calculated or estimated by the control system 140 based on a voltage or energy supplied to the gas discharge electrodes within the optical source 105 or 505, an output energy E(110) of the light beam 110, and the differential timing. For example, MPOP can be estimated by:

$$MPOP = \frac{1}{E(110)} \frac{dVlotage}{dMOPAtiming},$$

where dVoltage/dMOPAtiming is an estimate of the sensitivity of the output voltage (supplied in the trigger signal to the first stage or the second stage) to a change in the differential timing. The value of dVoltage/dMOPAtiming can be estimated by the control system 140 in real-time by utilizing the data provided to the first actuation module 120 for the output voltage and the actual differential timing (such characteristics being observed or detected by the observation system 405). The estimation to MPOP is updated on a pulse-to-pulse basis, although the enough data needs to be provided to make an accurate estimation of MPOP.

During operation of the optical source 105, it is desired to produce the light beam 110 while regulating the operating point (and therefore the metric for the operating point) of the first actuatable apparatus 130 about a set point that is offset from the peak efficiency differential timing. The other properties (for example, wavelength and energy of the light beam 110) of the optical source 105 can be adjusted (for example, linearized) around this known operating point.

The observation system 405 can detect or sense aspects of the optical source 105 or 505 such as the input energy to the optical source 105 or 505, the energy of the light beam 110, and the actual relative timing. Thus, the observation system 405 can be an energy detector that detects the energy of the light beam 110. The observation system 405 can be a voltage meter connected to an electric signal sent to the electrodes of the gas discharge chambers of the optical source 505. The observation system 405 can be a current or voltage meter that detects when the respective trigger signals are sent to the electrodes of the respective master oscillator and power amplifier.

As shown in FIG. 4, the metrology apparatus 450 also includes a spectral feature unit 410 that is configured to measure a spectral feature of the pulsed light beam 110 output from the optical source 105. In some implementations, the spectral feature unit 410 includes a beam separator such as a beam splitter that is placed in the path of the light beam 110 to remove and direct a fraction (for example, about 1-2%) of the light beam 110 to a spectrometer. The spectrometer includes a spectrum dispersing device and a detector that is sensitive to the wavelengths of the light beam 110.

The spectrum dispersing device separates the light beam into different distributions of spectral features, and the detector has a plurality of spatial areas, where each spatial area receives a different distribution of spectral features. In some implementations, the spectrum dispersing device is an optical interference-based device in which the light beam is separated into the different distributions of spectral features by producing a plurality of light beams that optically interfere with each other. An exemplary optical interference-based device is an etalon or a grating. Such a device can be used in conjunction with a lens that is configured to project the different distributions onto the distinct spatial areas of the detector. The lens can be placed at the output of the etalon so that it images the light to a focal plane that coincides with the spatial areas of the detector. In other implementations, the spectrum dispersing device is an optical dispersive-based device in which the light beam is separated into the different distributions of spectral features using the optical phenomenon of refraction. An exemplary optical dispersive-based device is a prism in which the different wavelengths of the light beam are refracted by different angles through the prism because the refractive index of the material of the prism varies with the wavelength of the light beam.

The detector detects a characteristic of the projected light beam (such as, the intensity) at each spatial area. For example, the detector can detect or sense an energy deposited at each spatial area by the respective spectral feature distribution. A spatial area is any surface or region onto which the photons of the spectral feature distribution impinge and interact, and the spatial area is able to convert the energy of the photons into an electric current for further processing by the control system 140. In some implementations, the detector includes a photodiode detector having an array of photodiodes, with each photodiode acting as a distinct spatial area. Each spatial area of the detector can be a surface made up of one or more imaging elements (for example, photodiodes) of the detector.

The spectral feature can be measured by estimating a value of a metric from the optical spectrum (that can be recovered or estimated from the output of the detector). Any suitable mathematical construction (that is, metric) related to the details of the optical spectrum 200 can be used to estimate a value that characterizes the bandwidth of the light beam. For example, the full width of the spectrum at a fraction (X) of the maximum peak intensity of the spectral shape (referred to as FWXM) can be used to characterize the light beam bandwidth. As another example, the width of the spectrum that contains a fraction (Y) of the integrated spectral intensity (referred to as EY) can be used to characterize the light beam bandwidth.

The metrology apparatus 450 can include one or more other measurement units 415 that can be used to measure other aspects of the optical source 105, the light beam 110, or the output apparatus 145.

Figure 5:
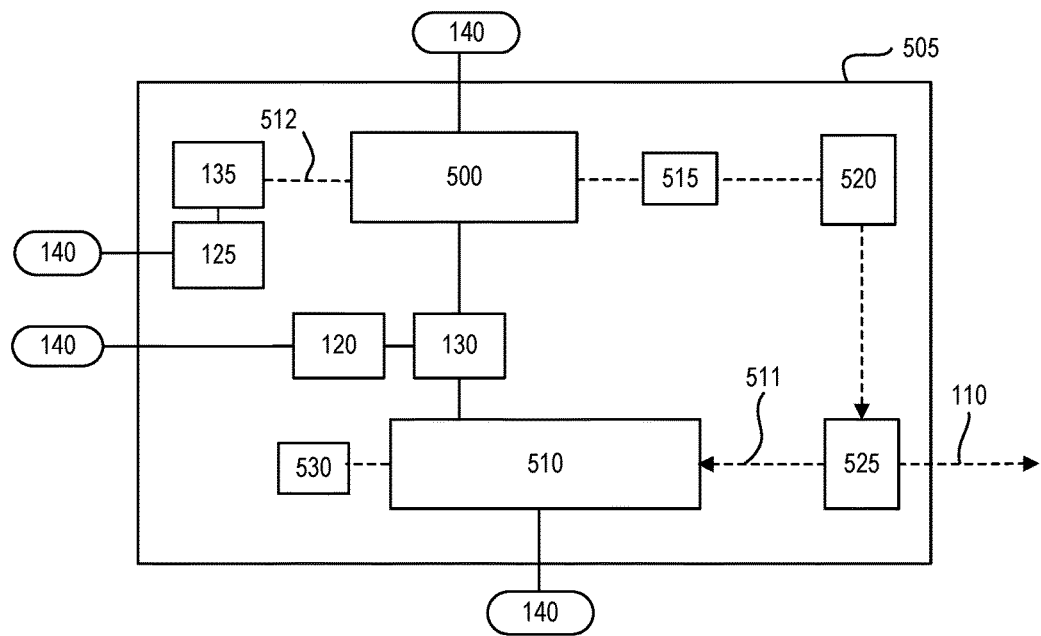
FIG. 5 is a block diagram of an implementation of an optical source that can be used in the photolithography system of FIG. 1.

Referring to FIG. 5, in some implementations, the optical source 105 is a pulsed laser optical source 505 that produces a pulsed laser beam as the light beam 110. As shown in the example of FIG. 5, the optical source 505 is a multi-stage (for example, two-stage) laser system that includes a master oscillator (MO) 500 that provides a seed light beam 511 to a power amplifier (PA) 510. The master oscillator 500 typically includes a gain medium in which amplification occurs and an optical feedback mechanism such as an optical resonator. The power amplifier 510 typically includes a gain medium in which amplification occurs when seeded with the seed laser beam 511 from the master oscillator 500. If the power amplifier 510 is designed as a regenerative ring resonator then it is described as a power ring amplifier (PRA), and in this case, enough optical feedback can be provided from the ring design. The master oscillator 500 enables fine tuning of spectral parameters such as the center wavelength and the bandwidth at relatively low output pulse energies (when compared with the output of the power amplifier 510). The power amplifier 510 receives the seed light beam 511 from the master oscillator 500 and amplifies the seed light beam 511 to attain the necessary powers for output to use in the output apparatus 145 (for example, for photolithography).

The master oscillator 500 includes a discharge chamber having two elongated electrodes, a laser gas that serves as the gain medium, a fan for circulating the gas between the electrodes. A laser resonator is formed between the second actuatable apparatus 135 (which acts as a spectral feature selection system) on one side of the discharge chamber and an output coupler 515 on a second side of the discharge chamber. The optical source 505 can also include a line center analysis module (LAM) 520 that receives an output from the output coupler 515. The LAM 520 can provide one of the other measurements units 415 of the metrology apparatus 450 shown in FIG. 4. The LAM 520 is an example of one type of measurement unit 315 that can be used to measure the wavelength (for example, the center wavelength) of the seed light beam 511 or the pulsed light beam 110. The optical source 505 can also include one or more beam modification optical systems 525 that modify the size and/or shape of the seed light beam 511 or the pulsed light beam 110 as needed.

The laser gas used in the discharge chamber can be any suitable gas for producing a laser beam around the required wavelengths and bandwidth, for example, the laser gas can be argon fluoride (ArF), which emits light at a wavelength of about 193 nm, or krypton fluoride (KrF), which emits light at a wavelength of about 248 nm.

The power amplifier 510 includes a power amplifier discharge chamber, and, if it is a regenerative ring amplifier, the power amplifier also includes a beam return (such as a reflector) 530 that returns (via reflection, for example) the light beam back into the discharge chamber to form a circulating and looped path (in which the input into the ring amplifier intersects the output out of the ring amplifier). The power amplifier discharge chamber includes a pair of elongated electrodes, a laser gas that serves as the gain medium, and a fan for circulating the gas between the electrodes. The seed light beam 511 is amplified by repeatedly being passed through the power amplifier 510. The beam modification optical system 525 provides a way (for example, a partially-reflecting mirror) to in-couple the seed light beam 511 to the power amplifier 510 and to out-couple a portion of the amplified radiation from the power amplifier 510 to form the output light beam 110.

The line center analysis module 520 monitors the wavelength of the output of the master oscillator 500. The line center analysis module 520 can be placed at other locations within the optical source 105, or it can be placed at the output of the optical source 105.

Spectral features of the seed light beam 511 (and therefore the output light beam 110) are determined by the configuration of the master oscillator 500, and these spectral features can be adjusted by adjusting a light beam 512 that is produced within the master oscillator 500. The second actuatable apparatus 135 (which acts as a spectral feature selection system) receives the light beam 512 from the master oscillator 500 of the optical source 505, and finely tunes the spectral output of the light beam 110 produced by the optical source 505 by finely tuning the spectral features of the light beam 512 based on the input from the control system 140.

Figure 6:
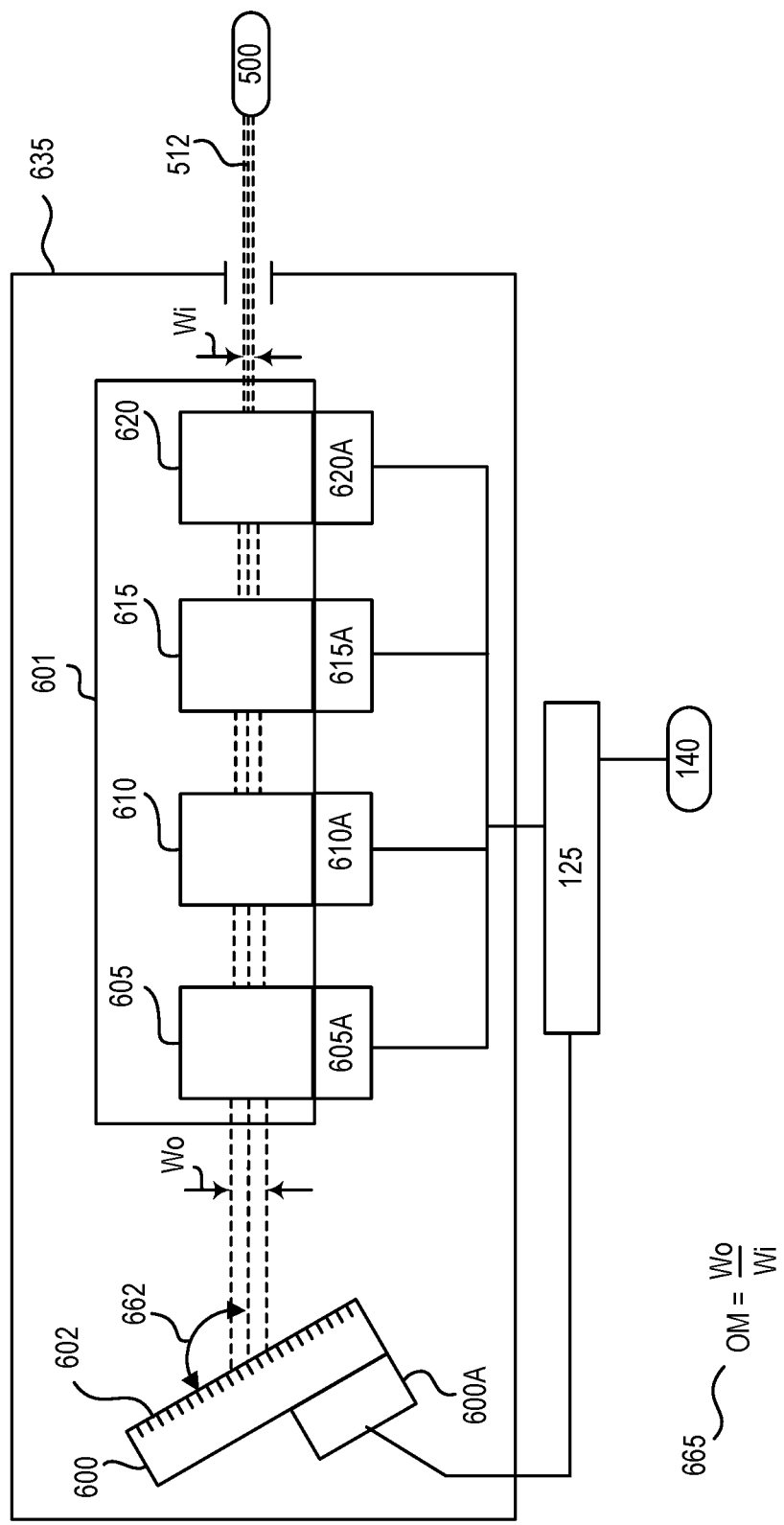
FIG. 6 is a block diagram of an implementation of the second actuatable apparatus that can be used in the actuation system of FIG. 1.

Referring also to FIG. 6, an exemplary second actuatable apparatus 635 is shown that couples to light beam 512 from the optical source 505. In some implementations, the second actuatable apparatus 635 receives the light beam 512 from the master oscillator 500 to enable the fine tuning of the spectral features such as wavelength and bandwidth within the master oscillator 500 to adjust these spectral features of the seed light beam 511. The second actuatable apparatus 635 is connected to the second actuation module 125, which communicates with the control system 140.

The second actuatable apparatus 635 includes a set of optical features or components 600, 605, 610, 615, 620 arranged to optically interact with the pulsed light beam 512 from the master oscillator 500. The optical components 600, 605, 610, 615, 620 can be configured to provide a coarse spectral feature adjustment system; and, if the adjustment of such components is rapid enough, it can be configured to provide a fine spectral feature adjustment system. Although not shown in FIG. 6, it is possible for the second actuatable apparatus 635 to include other optical features or other non-optical features for providing fine spectral feature control.

The second actuation module 125 is connected to one or more actuation systems 600A, 605A, 610A, 615A, 620A physically coupled to respective optical components 600, 605, 610, 615, 620. The optical component 600 can be a dispersive optical element 600, such as a grating and the optical components 605, 610, 615, 620 can be refractive optical elements that collectively form a beam expander 601. The grating 600 can be a reflective grating that is designed to disperse and reflect the light beam 512; accordingly, the grating 600 is made of a material that is suitable for interacting with a pulsed light beam 512 having a wavelength in the DUV range. Each of the prisms 605, 610, 615, 620 is a transmissive prism that acts to disperse and redirect the light beam 512 as it passes through the body of the prism. Each of the prisms can be made of a material (such as, for example, calcium fluoride) that permits the transmission of the wavelength of the light beam 512. Although four refractive optical elements 605, 610, 615, 620 are shown, it is possible for fewer than four or more than four to be used in the beam expander 601.

The pulsed light beam 512 travels through the prism 620, the prism 610, and the prism 605, in that order, prior to impinging upon a diffractive surface 602 of the grating 600. With each passing of the beam 512 through a consecutive prism 620, 615, 610, 605, the light beam 512 is optically magnified and redirected (refracted at an angle) toward the next optical component. The light beam 512 is diffracted and reflected from the grating 600 back through the prism 605, the prism 610, the prism 615, and the prism 620, in that order, prior to exiting the apparatus 635. With each passing through the consecutive prisms 605, 610, 615, 620 from the grating 600, the light beam 512 is optically compressed as it travels back toward the master oscillator 500.

The rotation of a prism (which can be any one of prisms 605, 610, 615, 620) of the beam expander 601 changes an angle of incidence at which the light beam 512 impinges upon the entrance surface of that rotated prism. Moreover, two local optical qualities, namely, an optical magnification and a beam refraction angle, of the light beam 512 through that rotated prism are functions of the angle of incidence of the light beam 512 impinging upon the entrance surface of that rotated prism. The optical magnification of the light beam 512 through the prism is the ratio of a transverse width of the light beam 512 exiting that prism to a transverse width of the light beam 512 entering that prism.

A change in the local optical magnification of the light beam 512 at one or more of the prisms within the beam expander 601 causes an overall change in the optical magnification OM 665 of the light beam 512 through the beam expander 601. The optical magnification OM 665 of the light beam 512 through the beam expander 601 is the ratio of the transverse width Wo of the light beam 512 exiting the beam expander 601 to a transverse width Wi of the light beam 512 entering the beam expander 601. Additionally, a change in the local beam refraction angle through one or more of the prisms within the beam expander 601 causes an overall change in an angle of incidence of 662 of the light beam 512 at the surface 602 of the grating 600.

The wavelength of the light beam 512 can be adjusted by changing the angle of incidence 662 at which the light beam 512 impinges upon the diffractive surface 602 of the grating 600. Specifically, this can be done by rotating one or more of the prisms 605, 610, 615, 620 and the grating 600 to thereby adjust the angle of incidence 662 of the light beam 512. The bandwidth of the light beam 512 can be adjusted by changing the optical magnification OM 665 of the light beam 512. Thus, the bandwidth of the light beam 512 can be adjusted by rotating one or more of the prisms 605, 610, 615, 620, which causes the optical magnification 665 of the light beam 512 to change. Because the rotation of a particular prism causes a change in both the local beam refraction angle and the local optical magnification at that prism, the control of wavelength and bandwidth are coupled in this design.

Additionally, the bandwidth of the light beam 512 is relatively sensitive to the rotation of the prism 620 and relatively insensitive to rotation of the prism 605. This is because any change in the local optical magnification of the light beam 512 due to the rotation of the prism 620 is multiplied by the product of the change in the optical magnification in the other prisms 615, 610, and 605 because those prisms are between the rotated prism 620 and the grating 600, and the light beam 512 must travel through these other prisms 615, 610, 605 after passing through the prism 620. On the other hand, the wavelength of the light beam 512 is relatively sensitive to the rotation of the prism 605 and relatively insensitive to the rotation of the prism 620. For example, in order to change the bandwidth without changing the wavelength, the optical magnification 665 should be changed without changing the angle of incidence 662, and this can be achieved by rotating the prism 620 by a large amount and rotating the prism 605 by a small amount.

Although an actuation system 600A, 605A, 610A, 615A, 620A is shown for each of the optical components 600, 605, 610, 615, 620, it is possible that some of the optical components are either kept stationary or are not physically coupled to an actuation system. For example, in some implementations, the grating 600 can be kept stationary and the prism 615 can be kept stationary and not physically coupled to an actuation system. One or more of the actuation systems 600A, 605A, 610A, 615A, 620A include one or more actuators that are connected to its respective optical components. The adjustment of the optical components causes the adjustment in the particular spectral features (the wavelength and/or bandwidth) of the light beam 512. The second actuation module 125 receives a control signal from the control system 140, the control signal including specific commands to operate or control one or more of the actuation systems. The actuation systems can be selected and designed to work cooperatively.

Each of the actuators of the actuation systems 600A, 605A, 610A, 615A, 620A is a mechanical device for moving or controlling the respective optical component. The actuators receive energy from the second actuation module 125, and convert that energy into some kind of motion imparted to the respective optical component. For example, the actuation systems can be any one of force devices and rotation stages for rotating one or more of prisms of a beam expander. The actuation systems can include, for example, motors such as stepper motors, valves, pressure-controlled devices, piezoelectric devices, linear motors, hydraulic actuators, voice coils, etc.

The grating 600 can be a high blaze angle Echelle grating, and the light beam 512 incident on the grating 600 at any angle of incidence 662 that satisfies a grating equation will be reflected (diffracted). The grating equation provides the relationship between the spectral order of the grating 600, the diffracted wavelength (the wavelength of the diffracted beam), the angle of incidence 662 of the light beam 512 onto the grating 600, the angle of exit of the light beam 512 diffracted off the grating 600, the vertical divergence of the light beam 512 incident onto the grating 600, and the groove spacing of the diffractive surface of the grating 600. Moreover, if the grating 600 is used such that the angle of incidence 662 of the light beam 512 onto the grating 600 is equal to the angle of exit of the light beam 512 from the grating 600, then the grating 600 and the beam expander (the prisms 605, 610, 615, 620) are arranged in a Littrow configuration and the wavelength of the light beam 512 reflected from the grating 600 is the Littrow wavelength. It can be assumed that the vertical divergence of the light beam 512 incident onto the grating 600 is near zero. To reflect the nominal wavelength, the grating 600 is aligned, with respect to the light beam 512 incident onto the grating 600, so that the nominal wavelength is reflected back through the beam expander (the prisms 605, 610, 615, 620) to be amplified in the optical source 105. The Littrow wavelength can then be tuned over the entire gain bandwidth of the resonators within optical source 105 by varying the angle of incidence 662 of the light beam 512 onto the grating 600.

Each prism optically magnifies the light beam 512 on the path toward the grating 600 from the master oscillator 500, and therefore each prism is successively larger in size from the prism 620 to the prism 605. Thus, the prism 605 is larger than the prism 610, which is larger than the prism 615, and the prism 620 is the smallest prism. The wavelength can be coarsely changed by rotating the prism 605, and the prism 620 can be rotated (in a coarse manner). The angle of incidence 662 of the light beam 512 is changed due to the rotation of the prism 605 and the rotation of the prism 620 offsets the change in magnification caused by the rotation of the prism 605. The prism 620 can be used for coarse, large range, and slow bandwidth control. By contrast, the bandwidth can be controlled in a fine and narrow range and even more rapidly by controlling the prism 610.

In the example of FIG. 5, the first actuatable apparatus 130 is a timing module that is connected to the first stage (the master oscillator 500) and to the second stage (the power amplifier 510) to control a relative timing between a first trigger signal sent to the master oscillator 500 and a second trigger signal sent to the power amplifier 510. Exemplary timing modules are shown and described in U.S. Pat. Nos. 7,830,934 and 7,203,216, both of which are incorporated herein by reference in their entirety. By adjusting the relative timing between the two trigger signals, the spectral feature (such as the bandwidth) of the light beam 110 can be controlled. In particular, the seed light beam 511 from the master oscillator 500 should pass through the discharge region of the power amplifier 510 during a time when the population is inverted in the laser gas within the power amplifier 510 so that the amplification of the seed light beam 511 can occur within the power amplifier 510. Thus, it may be that by delaying the pulse of the seed light beam 511, the bandwidth of the light beam 110 output from the power amplifier 510 is reduced, depending on which the population is inverted in the laser gas of the power amplifier 510. In general, the longer that a pulse of the seed light beam 511 remains in the master oscillator 500, the narrower will be the bandwidth of the light beam 110 output by the power amplifier 510. Hence, relative timing actuation between the trigger signal to the master oscillator 500 and the trigger signal to the power amplifier 510 can be used to control the bandwidth of the light beam 110.

Since relative timing between these trigger signals can be changed on every laser light pulse, such control provides a more fine-tuned and more rapid method of controlling the spectral feature than is provided with the second actuation module 125, which is constrained by how fast the optical feature on the path of the light beam 512 can be physically moved.

Together, such coordination and cooperation between the two actuatable apparatuses 130, 135 can be employed by the control system 140 to hold or maintain one or more spectral features (such as the wavelength or bandwidth) at a desired setpoint or at least within a desired range around a setpoint, even though the optical source 105 may be subjected to a wide array of disturbances 107.

The control system 140 is connected to the first actuation module 120, the second actuation module 125, and the metrology apparatus 150. A connection between the control system 140 and a specific component (such as the metrology apparatus 150) can be a wired connection or can be a wireless and non-contact connection.

Figure 7:
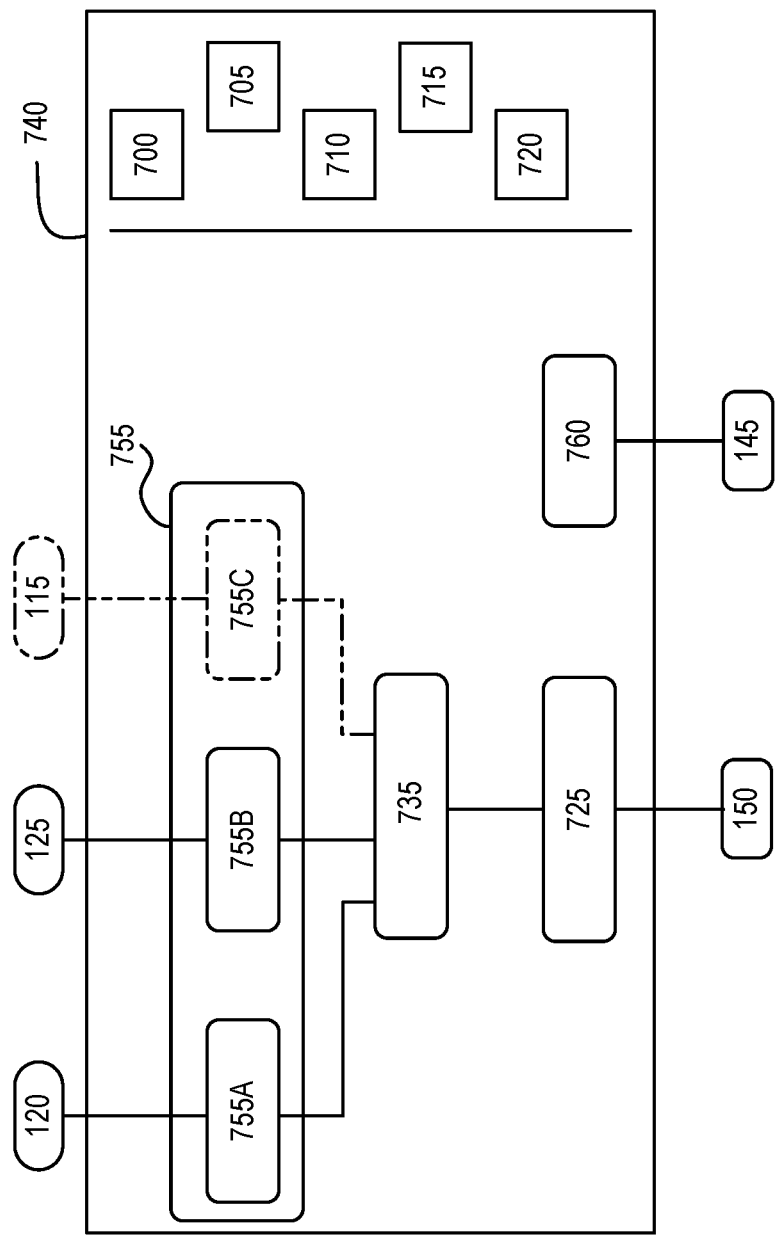
FIG. 7 is a block diagram of an implementation of a control system of the photolithography system of FIG. 1.

Referring to FIG. 7, an example of the control system 140 is shown as control system 740. Details about the control system 740 are provided that relate to the aspects of the system and method described herein. The control system 740 can include other features not shown in FIG. 7. The control system 740 includes one or more of digital electronic circuitry, computer hardware, firmware, and software.

The control system 740 includes memory 700, which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. The control system 740 can also include one or more input devices 705 (such as, for example, one or more of a keyboard, touch screen, microphone, mouse, hand-held input device) and one or more output devices 710 (such as, for example, a speaker or a monitor).

The control system 740 includes one or more programmable processors 715, and one or more computer program products 720 tangibly embodied in a machine-readable storage device for execution by a programmable processor (such as the processors 715). The one or more programmable processors 715 can each execute a program of instructions to perform desired functions by operating on input data and generating appropriate output. Generally, the processor 715 receives instructions and data from memory 700. Any of the foregoing may be supplemented by, or incorporated in, specially designed ASICs (application-specific integrated circuits).

The control system 740 includes, for example, a metrology processing module 725, a decision processing module 735, an actuation processing module 755 (which can include sub-modules 755A, 755B for interfacing with respective actuation modules 120, 125), and an output apparatus module 760. Each of these processing modules can be a set of computer program products executed by one or more processors such as the processors 715.

The output apparatus module 760 interfaces with the output apparatus 145, for example, with the lithography controller 362 of the exposure apparatus 345. In this way, the output apparatus module 760 receives commands or instructions from the lithography controller 362 regarding the modes of operation of the photolithography system 100. For example, the output apparatus module 760 receives commands from the lithography controller 362 regarding a target value of a spectral feature of the light beam 110. The output apparatus module 760 can receive a command from the lithography controller 362 to change a spectral feature of the light beam 110 from a value in a first target range of values to a value in a second target range of values. The output apparatus module 760 also interfaces with the metrology processing module 725 to operate the actuation system 115 in one of the modes of operation, for example, the steady state operation mode or the change state operation mode.

The metrology processing module 725 receives the output from each of the observation system 405, the spectral feature unit 410, and other measurement units 415 of the metrology apparatus 450. The decision processing module 735 receives the outputs from the metrology processing module 725 and determines which actuation sub-modules 755A, 755B needs to be activated or controlled. The metrology processing module 725 receives the commands from the output apparatus module 760 and performs calculations based on these commands. For example, if the output apparatus module 760 instructs the metrology processing module 725 to change a spectral feature of the light beam 110 from a value in a first target range of values to a value in a second target range of values, then the metrology processing module 725 can begin performing calculations necessary to perform and complete the change state operation. The metrology processing module 725 can also send instructions to the decision processing module 735 based on these calculations to thereby operating the actuation system 115 in the change state operation. Details about the change state operation are provided below.

The actuation processing module 755 can include one or more additional sub-modules 755C that interface with other actuation modules of the actuation system 115. Moreover, while only a few processing systems are shown in FIG. 7, it is possible for the control system 140 to include other processing systems. Additionally, although the control system 140 is represented as a box in which all of the components appear to be co-located, it is possible for the control system 140 to be made up of components that are physically remote from each other.

In general, the metrology processing module 725 receives at least some information about the light beam 110 and the optical source 105 from the metrology apparatus 150, as well as information about the exposure apparatus 345 from the lithography controller 362. The metrology processing module 725 performs an analysis or analyses on the information to determine how to adjust one or more spectral features (for example, the bandwidth) of the light beam 110 supplied to the output apparatus 145. Based on this determination by the metrology processing module 725, the decision processing module 735 sends signals to the actuation processing module 755 to control operation of the optical source 105 by way of the sub-modules 755A and 755B.

The first and second actuation modules 120, 125 include electronics in the form of any combination of firmware and software, as needed, in order to communicate with the actuation processing module 755 and the respective first and second actuator apparatuses 130, 135.

Figure 8:
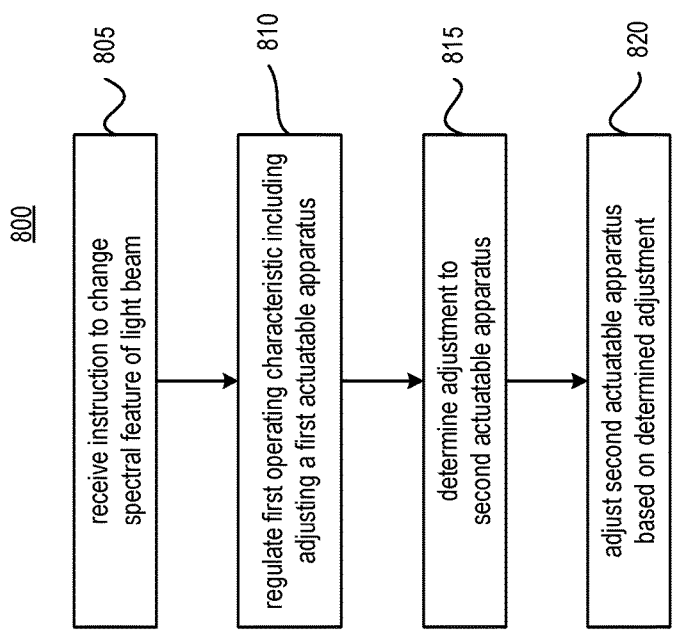
FIG. 8 is a flow chart of a procedure that can be performed by the photolithography system of FIG. 1 for a change state operation.

Referring to FIG. 8, a procedure 800 is performed to execute a change state operation in which the spectral feature of the pulsed light beam 110 produced by the optical source 105 is adjusted. The procedure 800 is performed by the photolithography system 100 under control of the control system 140. The procedure 800 includes receiving an instruction to change a spectral feature of the pulsed light beam 110 from a value in a first target range to a value in a second target range (805). For example, the output apparatus module 760 of the control system 740 can receive an instruction from the output apparatus 145 to change the spectral feature of the light beam 110 and this instruction can be conveyed to the metrology processing module 725.

The procedure 800 includes regulating a first operating characteristic of the optical source 105 (810) The first operating characteristic of the optical source 105 is regulated (810) by adjusting the first actuatable apparatus 130 of the optical source 105 until it is determined that the first operating characteristic is within an acceptable range of values. This adjustment of the first actuatable apparatus 130 is initiated and controlled by the sub-module 755A of the actuation processing module 755 under control of the decision processing module 735 and based on inputs from the metrology processing module 725 and/or the output apparatus module 760.

The acceptable range of values of the first operating characteristic can be a range of values centered in an operating range of the first operating characteristic. For example, the operating range is defined by limiting values of the first operating characteristic. Specifically, the first operating characteristic could not be pushed to a value beyond these limiting values. Thus, regulation (810) seeks to center the first operating characteristic in the center of its operating range during the change state operation.

The first operating characteristic can be a relative value between a current state of the first actuatable apparatus 130 and a target state of the first actuatable apparatus 130. The first actuatable apparatus 130 can be a timing relating to when the optical source 105 outputs a pulse of the light beam 110. Moreover, this timing relating to when the optical source 105 outputs the pulse of the light beam 110 can be the relative timing between a first trigger signal sent from the control system 140 to the first stage of the optical source (such as the master oscillator 500 of the optical source 505) and a second trigger signal sent from the control system 140 to the second state of the optical source (such as the power amplifier 510 of the optical source 505).

The change or adjustment to the first actuatable apparatus 130 causes a change in the first operating characteristic, and this change introduces an unwanted offset in the spectral feature of the light beam 110. For example, if the first operating characteristic has a value of −0.3 (arbitrary units) at the beginning of the procedure 800, and it is instructed to be in a range about a value of −0.4 (arbitrary units) at the beginning of regulation 810, then this change in the first operating characteristic can cause a shift in bandwidth of about 25 femtometers (fm).

The control system 140 determines an adjustment to the second actuatable apparatus 135 of the optical source 105 (815) that offsets that shift in the spectral feature caused by the change in the first operating characteristic. The control system 140 determines the adjustment (815) based at least in part on a relationship between the adjustment of the first actuatable apparatus 130 and the spectral feature of the light beam 110, and also based on the second target range. For example, the metrology processing module 725 can perform the calculation to determine the adjustment (815) based on, for example, information stored in memory 700, instructions from the output apparatus module 760, and/or information from the metrology apparatus 150.

The procedure 800 includes adjusting the second actuatable apparatus 135 by an amount that is based on the determined adjustment (820). Specifically, once the adjustment amount is determined (815) by the metrology processing module 725, a signal is sent to the decision processing module 735, which then determines a control signal to send to the sub-module 755B that communicates with the second actuation module 125 to thereby adjust the second actuatable apparatus 135. For example, if the second actuatable apparatus 135 is the second actuatable apparatus 635, then the adjustment to the second actuatable apparatus 635 adjusts one or more of the optical elements 605A, 610A, 615A, 620A to thereby adjust the optical magnification OM of the light beam 512. This adjustment to the optical magnification OM of the light beam 512 thereby alters the spectral feature (such as the bandwidth) of the light beam 512, and therefore alters the spectral feature of the light beam 110 directed to the output apparatus 145.

Moreover, the control system 140 can begin the determination (815) and begin the adjustment (820) prior to the initial determination that the first operating characteristic is within the acceptable range of values. Thus, the determination (815) and adjustment (820) can begin in parallel with the start of the regulation of the first operating characteristic (815). The determination (815) and the adjustment (820) can be considered as a feed forward control within the procedure 800 because the change to the second actuatable apparatus 135 is not based on an error in the state or load of the second actuatable apparatus 135. Rather, the determination (815) and adjustment (820) are based on factors other than the error in the state or load of the second actuatable apparatus 135, as discussed below.

Figure 9:
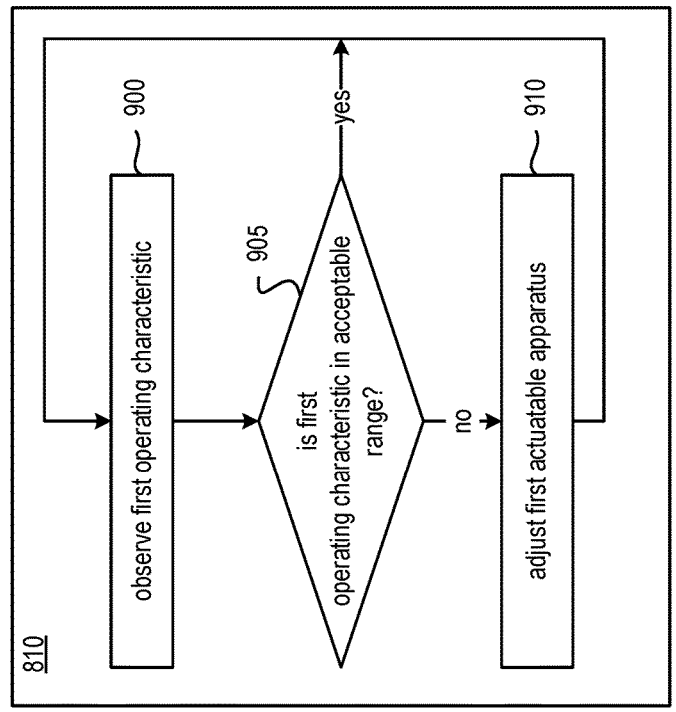
FIG. 9 is a flow chart of a procedure for regulating a first operating characteristic including adjusting the first actuatable apparatus.

Referring to FIG. 9, a procedure 810 is performed for regulating the first operating characteristic of the optical source 105. The procedure 810 is performed throughout the change state operation even though it is only shown once in FIG. 8. The first operating characteristic of the optical source 105 is observed (900) by the metrology apparatus 150. For example, the first operating characteristic can be the operating point of the first actuatable apparatus 130 and in this case, the observation system 405 observes the operating point. The metrology processing module 725 (of the control system 140) receives the value of the operating point from the observation system 405.

Next, the control system 140 determines whether the observed first operating characteristic is within an acceptable range of values (905). For example, the metrology processing module 725 determines whether the observed first operating characteristic is greater than a minimum value and less than a maximum value, where the minimum value and the maximum value define the acceptable range of values.

If the observed first operating characteristic is within the acceptable range of values (905), then the metrology apparatus 150 continues to observe the first operating characteristic of the optical source 105 (900) and no adjustment to the first actuatable apparatus 130 is needed. If the observed first operating characteristic is not within the acceptable range of values (905), then the first actuatable apparatus 130 is adjusted (910). For example, if the metrology processing module 725 determines that the observed first operating characteristic is outside the acceptable range of values (905), then it sends a signal to the decision processing module 735, which determines that the first actuatable apparatus 130 should be adjusted. The decision processing module 735 sends the appropriate signal to the actuation processing module 755, and specifically to the sub-module 755A, which sends a signal to the first actuation module 120 to thereby adjust the first actuatable apparatus 130.

Figure 10:
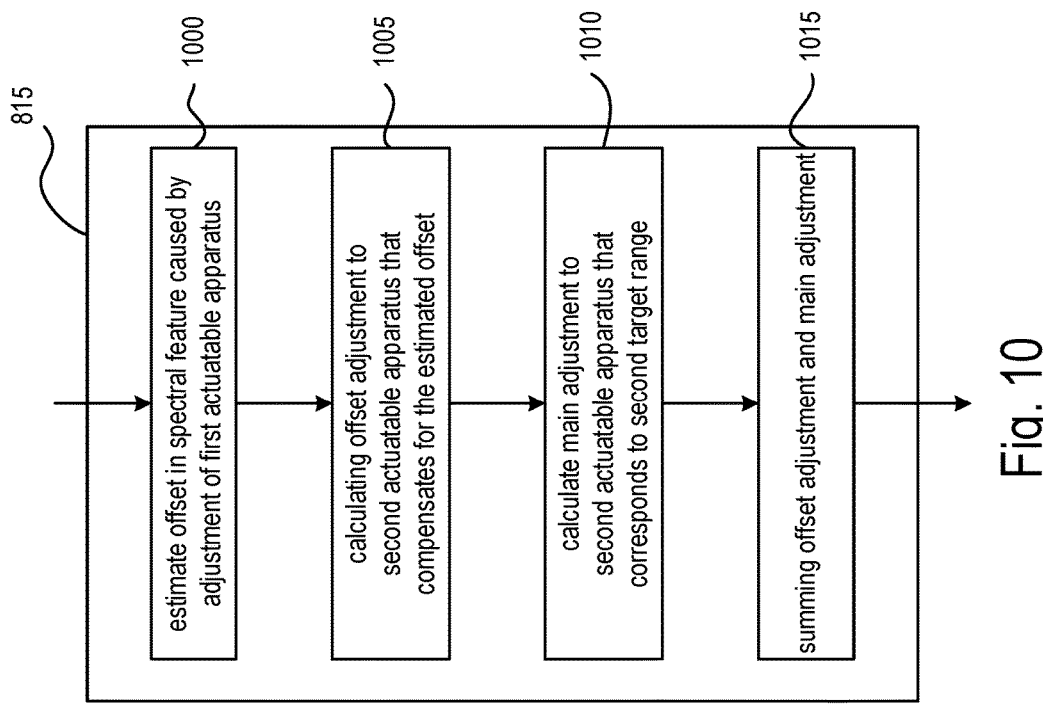
FIG. 10 is a flow chart of a procedure for determining an adjustment to the second actuatable apparatus.

Referring to FIG. 10, a procedure 815 is performed for determining the adjustment to the second actuatable apparatus 135 of the optical source 105. An offset in the spectral feature of the light beam 110 caused by the adjustment of the first actuatable apparatus 130 is estimated (1000). For example, the metrology processing module 725 can calculate how much the spectral feature of the light beam 110 will be changed due to the adjustment to the first actuatable apparatus 130.

Figure 11:
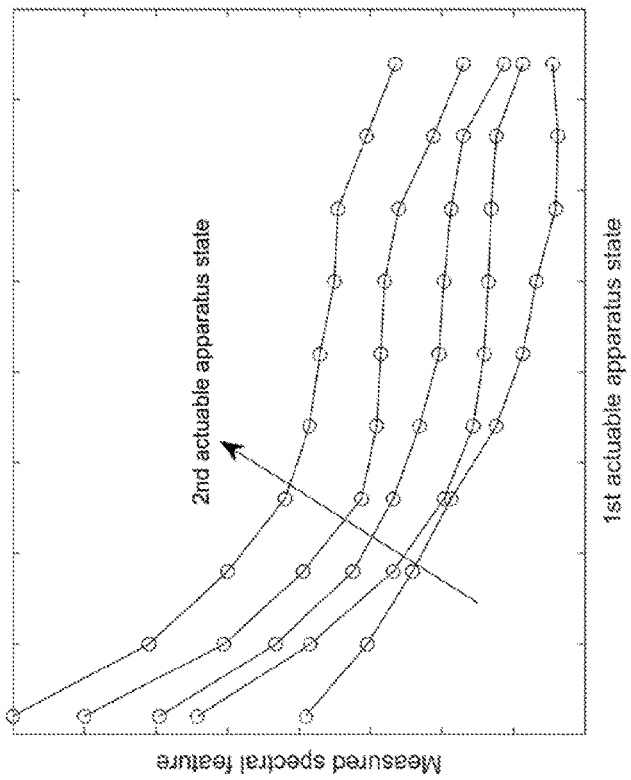
FIG. 11 is a graph of a timing curve of a measured spectral feature (SF) of the light beam versus the state of the first actuatable apparatus.

The metrology processing module 725 can estimate the spectral feature offset $SF_{off}$ (1000) based on the sensitivity of the first operating characteristic to the spectral feature. This sensitivity can be calculated by a model that relates the spectral feature with the state of the first actuatable apparatus 130. For example, the offset ($SF_{off}$) can be calculated as follows:

$$SF_{off} = \frac{\Delta op1}{CV} \times \frac{dSF}{dAct1},$$

where $\Delta op1$ is a difference between an initial value of the first operating characteristic and a target value of the first operating characteristic, CV is the configurable value that defines a relationship between the first operating characteristic and the state of the first actuatable apparatus 130, dSF/dAct1 is a slope of a timing curve of a measured spectral feature (SF) of the light beam 110 versus the state of the first actuatable apparatus 130. A set of exemplary timing curves are shown in FIG. 11 for distinct states of the second actuatable apparatus 135 (for example, for distinct angles of the prism 620). The target value of the first operating characteristic is within the acceptable range of values and the initial value of the first operating characteristic can be the value prior to the start of the procedure 800. The configurable value CV defines a DC gain between the state of the first actuatable apparatus 130 and the first operating characteristic and is set prior to the start of the procedure 800.

Once the spectral feature offset $SF_{off}$ is estimated (1000), the control system 140 calculates an offset adjustment to the second actuatable apparatus 135 that compensates for the estimated spectral feature offset $SF_{off}$ of the light beam 110 caused by the adjustment of the first actuatable apparatus 130 (1005). The decision processing module 735 can calculate this offset adjustment based on the estimated offset provided by the metrology processing module 725. The offset adjustment to the second actuatable apparatus 135 can be calculated by multiplying the estimated spectral feature offset (for example, $SF_{off}$) by a slope of the relationship between a measured spectral feature of the light beam 110 and a state of the second actuatable apparatus 135, as follows:

$$Act2_{off} = SF_{off} \times \frac{Act2_{state}}{SF_{meas}},$$

where $Act2_{off}$ is the calculated offset adjustment to the second actuatable apparatus 135, and $Act2_{state}/SF_{meas}$ is the slope of the relationship between the measured spectral feature ($SF_{meas}$) of the light beam 110 and the state of the second actuatable apparatus 135 ($Act1_{state}$).

For example, if the second actuatable apparatus 135 is designed like the second actuatable apparatus 635 shown in FIG. 6, then the decision processing module 735 calculates an adjustment to one or more of the actuation systems 605A, 610A, 615A, 620A (1005) to compensate for the estimated spectral feature offset (1000). For example, if the actuation system 620A is a stepper motor, the associated optical component 620 is a prism, and the spectral feature being adjusted is the bandwidth of the light beam 110, then the decision processing module 735 can calculate a number of steps through which the stepper motor 620A should be moved to thereby rotate the prism 620 and adjust the bandwidth. The decision processing module 735 may also calculate that other optical components (such as one or more of the other prisms 605, 610, or 615) need to be adjusted.

As discussed above, the control system 140 also determines the adjustment to the second actuatable apparatus 135 of the optical source 105 (815) based at least in part on the second target range. This adjustment is the main adjustment to the second actuatable apparatus 135 based on the instruction to change the spectral feature of the light beam 110, and is independent of whether such a change is impacted by or impacts the first actuatable apparatus 130. To this end, the procedure 815 also includes calculating a main adjustment ($Act2_{main}$) to the second actuatable apparatus 135 that corresponds to the second target range (1010). In the example discussed above, the decision processing module 735 would determine how much the prism 620 needs to be adjusted to adjust the bandwidth of the light beam 110 from a current value in a first target range to a value in a second target range.

Both calculated adjustments $Act2_{main}$ (at 1010) and $Act2_{off}$ (at 1005) to the second actuatable apparatus 135 are needed. The main adjustment $Act2_{main}$ is needed to perform the commanded change in the bandwidth of the light beam 110 (for example, as commanded by the output apparatus 145 via the output apparatus module 760). The offset adjustment $Act2_{off}$ is needed to compensate for an unwanted adjustment to the bandwidth that is caused by the initial adjustment of the first actuatable apparatus 130 to move the first actuatable apparatus 130 to an operating state (at 810). Thus, the procedure 815 therefore includes determining the overall adjustment $Act2_{overall}$ to the second actuatable apparatus 135 of the optical source 105 by adding the offset adjustment $Act2_{off}$ and the main adjustment $Act2_{main}$ together (1015).

Figure 12:
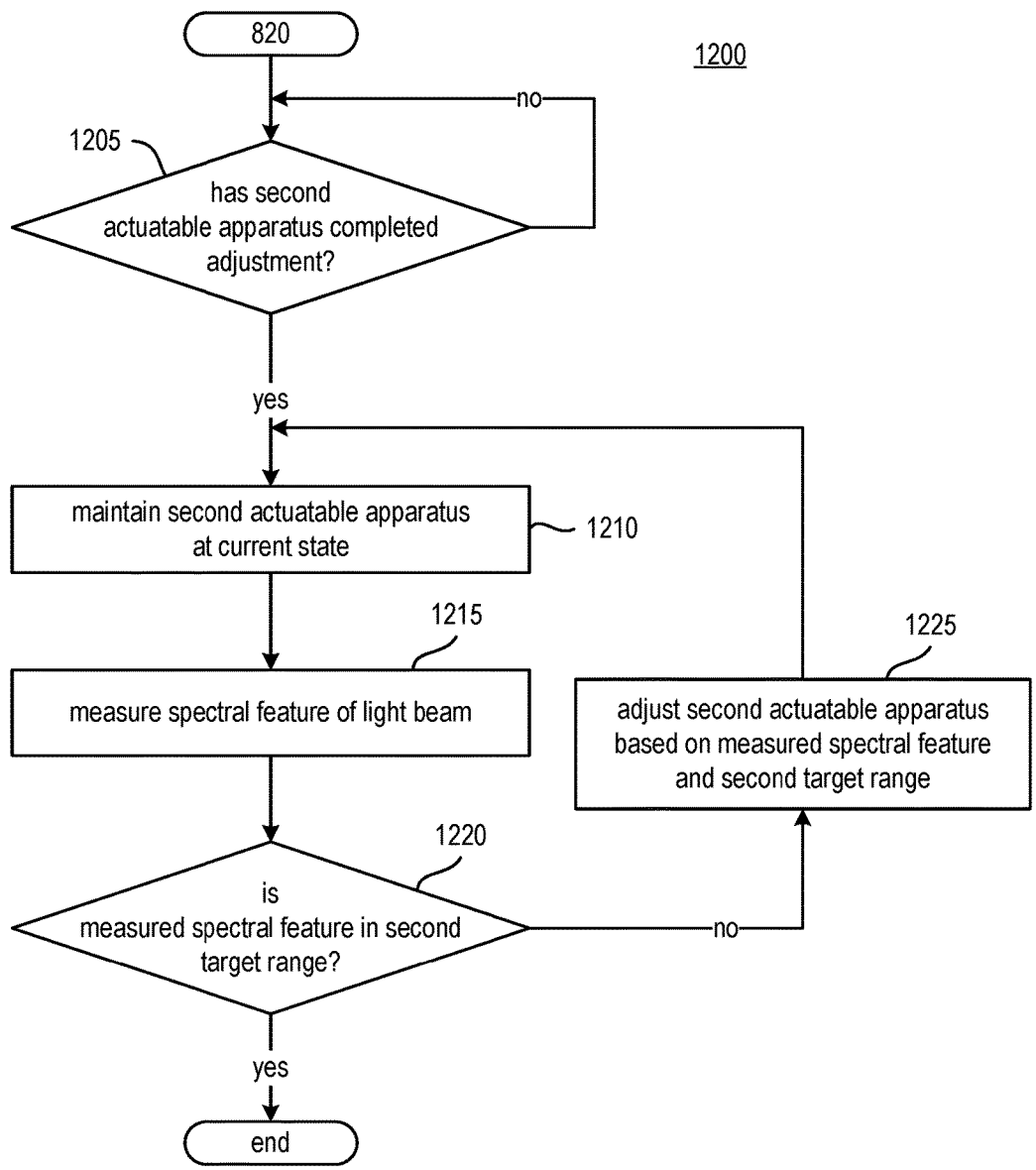
FIG. 12 is a flow chart of a procedure adjusting the second actuatable apparatus using a closed-loop control that can be performed after the completion of the procedure of FIG. 8.

Referring to FIG. 12, in some implementations, a procedure 1200 is performed after the second actuatable apparatus 135 is adjusted (820) based on the determined adjustment. Initially, the control system 140 determines whether the second actuatable apparatus 135 has completed its adjustment at 820 (1205). For example, the control system 140 could receive a signal from the metrology apparatus 150 indicating a status of the second actuatable apparatus 135. Once it has completed its adjustment (1205), then the second actuatable apparatus 135 is maintained at its current state (1210). For example, with reference to the exemplary second actuatable apparatus 635 shown in FIG. 6, the second actuation module 125 could send a signal to the actuation system 620A to keep the prism 620 stationary and in its current state.

Moreover, the second actuatable apparatus 135 can be maintained at its current state (1210) for a set number of pulses (for example, N, where N is a positive integer) of the light beam 110 directed to the output apparatus 145. The number of pulses during which the second actuatable apparatus 135 is maintained at its current state (1210) can be on the order of tens (for example, less than 40, 30, or 20).

The spectral feature of the pulsed light beam 110 is measured (1215) while the second actuatable apparatus 135 is maintained at its current state (1210). Specifically, the spectral feature unit 410 of the metrology apparatus 450 performs the measurement (1215) on the light beam 110. As discussed above, the spectral feature unit 410 measures the optical spectrum of the light beam 110, and the spectral feature of the light beam 110 is determined from the optical spectrum. The metrology processing module 725 can determine the spectral feature of the light beam 110 from the optical spectrum. Moreover, the spectral feature can be measured (1215) for each pulse of the light beam 110 that is directed to the output apparatus 145 while the second actuatable apparatus 135 is maintained at its current state (1210). Thus, in the example above, if N is 15, then the spectral feature can be measured (1215) for 15 pulses.

Next, the control system 140 determines whether the measured spectral feature (1215) is in the second target range (1220). For example, the metrology processing module 725 determines whether the measured spectral feature is less than an upper value of the second target range and greater than a lower value of the second target range. If the measured spectral feature (1215) is not in the second target range (1220), then the second actuatable apparatus 135 is adjusted based on how far the measured spectral feature is from the second target range (1225). For example, the decision processing module 735 sends a signal to the submodule 755B, which instructs the second actuation module 125 to affect the adjustment to the second actuatable apparatus 135 to adjust the spectral feature to a new value that is closer to or within the second target range. After the adjustment of the second actuatable apparatus 135 (1225), the procedure 1200 continues to maintain the second actuatable apparatus 135 in its current state (1210) while measuring the spectral feature of the light beam 110 (1215).

Although not shown in FIG. 12, if a plurality spectral features are measured (1215) while the second actuatable apparatus 135 is maintained at its current state (1210), then each measured spectral feature is stored within memory (for example, memory 700). In this case, the metrology processing module 725 can calculate an average value of the measured spectral feature, and that average value can be used at step 1220 as the measured spectral feature that is compared with the second target range.

If the control system 140 determines that the measured spectral feature (1215) is in the second target range (1220), then the change state operation is completed and the actuation system 115 can operate under steady state operation in which the output apparatus 145 requires that the spectral feature of the light beam 110 be held constant.

The adjustment of the spectral feature of the pulsed light beam 110 using the second actuation module 125 can cause an adjustment in the actual value at which the first actuatable apparatus 130 is operating and vice versa. This can happen because the first actuatable apparatus 130 and the second actuatable apparatus 135 are in series with each other, which means that when the value or setting of one is changed, then the value or setting of the second one is changed and both act to change the spectral feature. Thus, it is possible to predict or estimate how the change or adjustment to the first actuatable apparatus 130 (810) impacts the spectral feature and this information is used to determine the adjustment to the second actuatable apparatus (815).

In addition to controlling the spectral feature (such as the bandwidth), another spectral feature (such as the wavelength) can be controlled for example, by way of a closed-loop control with the second actuation module 125.

Some implementations of the procedures and apparatuses described herein reduce the total time for a change state operation relative to some known techniques by about 30-65% because the procedure 800 begins adjusting the second actuatable apparatus 135 (815) before the first operating characteristic is determined to be in its acceptable range of values. For example, in some known techniques, a change state operation takes about one second to complete; while in the procedures described herein, the change state operation takes about a half a second to complete. In this way, the output apparatus 145 can process, for example, the wafers 360, more quickly and the overall production from the output apparatus 145 is increased.

Other implementations are within the scope of the following claims.

What is claimed is:

1. A method for adjusting a spectral feature of a pulsed light beam produced by an optical source, the method comprising:
    receiving an instruction to change a spectral feature of the pulsed light beam from a value in a first target range to a value in a second target range;
    regulating a first operating characteristic of the optical source, wherein regulating the first operating characteristic includes adjusting a first actuatable apparatus of the optical source until it is determined that the first operating characteristic is within an acceptable range of values;
    determining an adjustment to a second actuatable apparatus of the optical source based at least in part on:
        a relationship between the adjustment of the first actuatable apparatus and a spectral feature of the light beam, and
        the second target range; and
    adjusting the second actuatable apparatus by an amount that is based on the determined adjustment.

2. The method of claim 1, wherein regulating the first operating characteristic of the optical source is performed as a feedback loop that comprises:
    observing the first operating characteristic of the optical source after the first actuatable apparatus is adjusted;
    determining whether the observed first operating characteristic is within the acceptable range of values; and
    adjusting a first actuatable apparatus of the optical source if it is determined that the observed first operating characteristic is outside the acceptable range of values.

3. The method of claim 1, wherein at least some of determining the adjustment to the second actuatable apparatus and at least some of adjusting the second actuatable apparatus occur before it is determined that the first operating characteristic is within the acceptable range of values.

4. The method of claim 1, wherein determining the adjustment to the second actuatable apparatus based on the relationship between the adjustment of the first actuatable apparatus and the spectral feature of the light beam comprises estimating an offset in the spectral feature of the light beam caused by the adjustment of the first actuatable apparatus.

5. The method of claim 4, wherein the offset is estimated based on:
    a difference between the initial value of the first operating characteristic and a target value of the first operating characteristic, wherein the target value of the first operating characteristic is within the acceptable range of values;
    a calibrated value that defines a relationship between the first operating characteristic and the state of the first actuatable apparatus; and
    a slope of a timing curve of a measured spectral feature of the light beam versus the state of the first actuatable apparatus.

6. The method of claim 4, wherein determining the adjustment to the second actuatable apparatus based on the relationship between the adjustment of the first actuatable apparatus and the spectral feature of the light beam comprises calculating an offset adjustment to the second actuatable apparatus that compensates for the estimated offset in the spectral feature of the light beam caused by the adjustment of the first actuatable apparatus.

7. The method of claim 6, wherein calculating the offset adjustment to the second actuatable apparatus that compensates for the estimated offset in the spectral feature of the light beam caused by the adjustment of the first actuatable apparatus comprises multiplying the estimated offset by a slope of the relationship between a measured spectral feature of the light beam and a state of the second actuatable apparatus.

8. The method of claim 6, wherein determining the adjustment to the second actuatable apparatus of the optical source based on the second target range comprises calculating a main adjustment to the second actuatable apparatus that corresponds to the second target range, wherein determining the adjustment to the second actuatable apparatus of the optical source comprises adding the offset adjustment and the main adjustment together to determine the adjustment.

9. The method of claim 1, further comprising, after the second actuatable apparatus has completed its adjustment:
maintaining the second actuatable apparatus at its current state while measuring the spectral feature of the light beam; and
adjusting the second actuatable apparatus until the measured spectral feature of the light beam is within the second target range.

10. The method of claim 9, wherein measuring the spectral feature of the light beam comprises measuring the spectral feature of the light beam for every pulse of the light beam in a set of N pulses, in which N is a number less than 30.

11. The method of claim 1, wherein:
the first operating characteristic of the optical source comprises a relative value between a state of the first actuatable apparatus and a target state of the first actuatable apparatus; and
the first actuatable apparatus is a timing relating to when the optical source outputs a pulse of the light beam.

12. The method of claim 11, wherein the timing relating to when the optical source outputs a pulse of the light beam is a relative timing between a first trigger signal sent to a first stage of the optical source and a second trigger signal sent to a second stage of the optical source.

13. The method of claim 1, wherein:
the second actuatable apparatus comprises an optical system configured to interact with the pulsed light beam; and
adjusting the second actuatable apparatus comprises adjusting the optical system to thereby adjust an optical magnification of the pulsed light beam and alter the spectral feature of the light beam.

14. The method of claim 1, wherein the spectral feature of the light beam is a bandwidth of the light beam.

15. The method of claim 1, wherein:
adjusting the first actuatable apparatus of the optical source causes the spectral feature of the light beam to change within a first extent of values and at a first speed;
adjusting the second actuatable apparatus of the optical source causes the spectral feature of the light beam to change within a second extent of values and at a second speed;
the second extent of values is larger than the first extent of values; and
the second speed is slower than the first speed.

16. The method of claim 1, wherein the acceptable range of values of the first operating characteristic is centered in an operating range of the first operating characteristic, wherein the operating range of the first operating characteristic is defined by limiting values of the first operating characteristic.

17. A system for adjusting a spectral feature of a pulsed light beam produced by an optical source, the system comprising:
a first actuation module coupled to a first actuatable apparatus of the optical source, the first actuatable apparatus configured to be adjusted by the first actuation module to thereby adjust the spectral feature of the pulsed light beam within a first extent of values;
a second actuation module coupled to a second actuatable apparatus of the optical source, the second actuatable apparatus configured to be adjusted by the first actuation module to thereby adjust the spectral feature of the pulsed light beam within a second extent of values; and
a control system connected to the first actuation module and the second actuation module, the control system configured to:
receive an instruction to change the spectral feature of the pulsed light beam from a value in a first target range to a value in a second target range;
regulate a first operating characteristic of the optical source, wherein regulating the first operating characteristic includes adjusting the first actuatable apparatus until it is determined that the first operating characteristic is within an acceptable range of values;
determine an adjustment to the second actuatable apparatus based at least in part on a relationship between the adjustment of the first actuatable apparatus and the spectral feature of the light beam, and the second target range; and
adjust the second actuatable apparatus by an amount that is based on the determined adjustment.

18. The system of claim 17, wherein the first operating characteristic of the optical source comprises a relative value between a state of the first actuatable apparatus and a target state of the first actuatable apparatus; and the first actuatable apparatus is a timing relating to when the optical source outputs a pulse of the light beam.

19. The system of claim 18, wherein:
the optical source is a multi-stage gas discharge system including a first stage and a second stage; and
the timing relating to when the optical source outputs a pulse of the light beam is a relative timing between a first trigger signal sent to the first stage of the optical source and a trigger signal sent to a second stage of the optical source.

20. The system of claim 19, with the first stage includes an oscillator apparatus that outputs a pulsed seed light beam and the second stage includes an optical amplification apparatus that receives the pulsed seed light beam and outputs the pulsed light beam.

21. The system of claim 17, wherein the second actuatable apparatus includes an optical system that interacts with the pulsed light beam and is configured to adjust an optical magnification of the pulsed light beam, wherein adjusting the optical magnification of the pulsed light beam thereby alters the spectral feature of the light beam.

22. The system of claim 21, wherein the optical system includes one or more prisms through which the pulsed light beam travels, and a grating on which the pulsed light beam reflects, wherein the optical magnification of the pulsed light beam is adjusted by rotating one or more of the prisms.

23. The system of claim 17, further comprising a metrology apparatus including an observation system configured to measure the first operating characteristic, wherein the control system is configured to receive the measurement of the first operating characteristic from the observation system.

24. The system of claim 23, wherein the metrology apparatus includes a spectral feature unit configured to measure the spectral feature of the pulsed light beam, wherein the control system is configured to receive the measurement of the spectral feature from the spectral feature unit.

25. A system for adjusting a spectral feature of a pulsed light beam produced by an optical source, the system comprising:
   a first actuatable means for adjusting the spectral feature of the pulsed light beam within a first extent of values;
   a first actuation means for controlling the first actuatable means;
   a second actuatable means for adjusting the spectral feature of the pulsed light beam within a second extent of values;
   a second actuation means for controlling the second actuatable means; and
   a control means connected to the first actuation means and the second actuation means, the control means for:
      receiving an instruction to change the spectral feature of the pulsed light beam from a value in a first target range to a value in a second target range;
      regulating a first operating characteristic of the optical source, wherein regulating the first operating characteristic includes sending a signal to the first actuation means to adjust the first actuatable means until it is determined that the first operating characteristic is within an acceptable range of values;
      determining an adjustment to the second actuatable means based at least in part on a relationship between the adjustment of the first actuatable means and the spectral feature of the light beam, and the second target range; and
      sending a signal to the second actuation means to adjust the second actuatable means by an amount that is based on the determined adjustment.

* * * * *